(12) United States Patent
Kawanabe et al.

(10) Patent No.: US 12,142,498 B2
(45) Date of Patent: Nov. 12, 2024

(54) CERAMIC STRUCTURE AND WAFER SYSTEM

(71) Applicant: KYOCERA Corporation, Kyoto (JP)

(72) Inventors: Yasunori Kawanabe, Kirishima (JP); Yoshihiro Okawa, Kirishima (JP)

(73) Assignee: KYOCERA Corporation, Kyoto (JP)

(*) Notice: Subject to any disclaimer, the term of this patent is extended or adjusted under 35 U.S.C. 154(b) by 857 days.

(21) Appl. No.: 17/277,244

(22) PCT Filed: Sep. 26, 2019

(86) PCT No.: PCT/JP2019/037996
§ 371 (c)(1),
(2) Date: Mar. 17, 2021

(87) PCT Pub. No.: WO2020/067357
PCT Pub. Date: Apr. 2, 2020

(65) Prior Publication Data
US 2021/0358775 A1 Nov. 18, 2021

(30) Foreign Application Priority Data

Sep. 28, 2018 (JP) ................................. 2018-183971

(51) Int. Cl.
H01L 21/67 (2006.01)
C04B 35/111 (2006.01)
H05B 3/28 (2006.01)

(52) U.S. Cl.
CPC ...... H01L 21/67103 (2013.01); C04B 35/111 (2013.01); H05B 3/28 (2013.01)

(58) Field of Classification Search
CPC ............... C04B 35/111; C04B 2235/75; C04B 2235/786; C04B 2235/945;
(Continued)

(56) References Cited

U.S. PATENT DOCUMENTS 6,486,542 B1 * 11/2002 Ohashi ............... H01L 21/4882
257/E23.009
6,878,906 B2 * 4/2005 Ito ..................... H01L 21/67109
219/448.11
(Continued)

FOREIGN PATENT DOCUMENTS

JP H05-101871 A 4/1993
JP 2001-332560 A 11/2001
(Continued)

OTHER PUBLICATIONS

Translation of JP2018016536A, Ceramic mamber, Feb. 1, 2018, by Proquest (Year: 2018).*

Primary Examiner — Quang T Van
(74) Attorney, Agent, or Firm — Procopio, Cory, Hargreaves & Savitch LLP

(57) ABSTRACT

A heater includes a base body, resistance heating element, and terminal part. The base body comprises ceramic, is plate shaped, and includes a hole on its lower surface. The resistance heating element is inside the base body. The terminal part is electrically connected to an internal conductor, is at least partially located inside the base body, and is exposed from a lower surface of the base body to an exterior of the base body. The terminal part includes a connection conductor that is inserted in the hole and connected to the internal conductor. A lower surface of the connection conductor is located on a side closer to the upper surface of the base body. The hole includes a reduced-diameter portion which has a diameter smaller than a diameter of the connection conductor between the lower surface of the connection conductor and the lower surface of the base body.

20 Claims, 7 Drawing Sheets

(58) Field of Classification Search
CPC . C04B 2237/68; C04B 35/581; G11B 5/5508; H01L 21/67103; H01L 21/68785; H05B 3/28
USPC .... 219/635, 637, 638, 385, 390, 444.1, 541, 219/443.1, 548, 552, 553, 520, 538, 219/121.58, 121.52, 121.4, 121.41, 219/121.43; 118/728, 723 E, 724, 725, 118/726; 156/89, 293, 345, 345.43, 156/345.51; 257/684, 701, 702, 703, 704, 257/705, 773, 774, 729, 730, 621; 428/209, 210, 551, 901, 621
See application file for complete search history.

(56) References Cited

U.S. PATENT DOCUMENTS

| | | | |
|---|---|---|---|
| 7,329,842 B2* | 2/2008 | Kushihashi | H01L 21/67103 219/520 |
| 2009/0176065 A1* | 7/2009 | Takebayashi | H01L 21/6833 428/173 |
| 2018/0033668 A1 | 2/2018 | Tsuchida | |

FOREIGN PATENT DOCUMENTS

| | | |
|---|---|---|
| JP | 2004-087392 A | 3/2004 |
| JP | 2010-177503 A | 8/2010 |
| JP | 2012-049185 A | 3/2012 |
| JP | 2018-016536 A | 2/2018 |

* cited by examiner

Gr

Gr

CERAMIC STRUCTURE AND WAFER SYSTEM

TECHNICAL FIELD

The present disclosure relates to a ceramic structure and a wafer system including the ceramic structure.

BACKGROUND ART

Known in the art is a ceramic structure on the upper surface of which a wafer is superimposed (for example PTL 1 or 2). Such a ceramic structure has a plate-shaped base body made of ceramic and an internal conductor positioned in an internal portion of the base body. Further, by application of voltage to the internal conductor, the ceramic structure, for example, exerts a function of heating the wafer, a function of picking the wafer by suction, a function of generating plasma around the wafer, or a combination of two or more of these functions. Such a ceramic structure is for example used in a semiconductor manufacturing apparatus.

Patent Literatures 1 and 2 disclose ceramic heaters provided with resistance heating elements as internal conductors inside base bodies made of ceramic. Such ceramic heaters have terminals which are electrically connected with the internal conductors and are exposed from the lower surfaces of the base bodies. The lower surfaces of the base bodies are shaped as flat surfaces. Further, the lower surfaces of the terminals become flush with the lower surfaces of the base bodies.

CITATION LIST

Patent Literature

Patent Literature 1: Japanese Patent Publication No. 2004-87392
Patent Literature 2: Japanese Patent Publication No. 5-101871

SUMMARY OF INVENTION

A ceramic structure according to one aspect of the present disclosure includes a base body, an internal conductor, and a terminal part. The base body is made of ceramic and is a plate shape includes an upper surface on which a wafer is superimposed and a lower surface on the opposite side to the upper surface. The internal conductor is located inside the base body. The terminal part is electrically connected to the internal conductor, is located inside the base body in at least a part, and is exposed from the lower surface of the base body to an exterior of the base body. The base body includes a hole opened at the lower surface of the base body. The terminal part includes a connection conductor. The connection conductor is inserted in the hole and is connected to the internal conductor. A lower surface of the connection conductor is located on a side closer to the upper surface of the base body other than the lower surface of the base body. The hole includes a reduced-diameter portion which has a diameter smaller than a diameter of the connection conductor between the lower surface of the connection conductor and the lower surface of the base body.

A wafer system according to one aspect of the present disclosure includes the ceramic structure described above, a power supply part which supplies power to the terminal part, and a control part which controls the power supply part.

DESCRIPTION OF EMBODIMENTS

Figure 1:
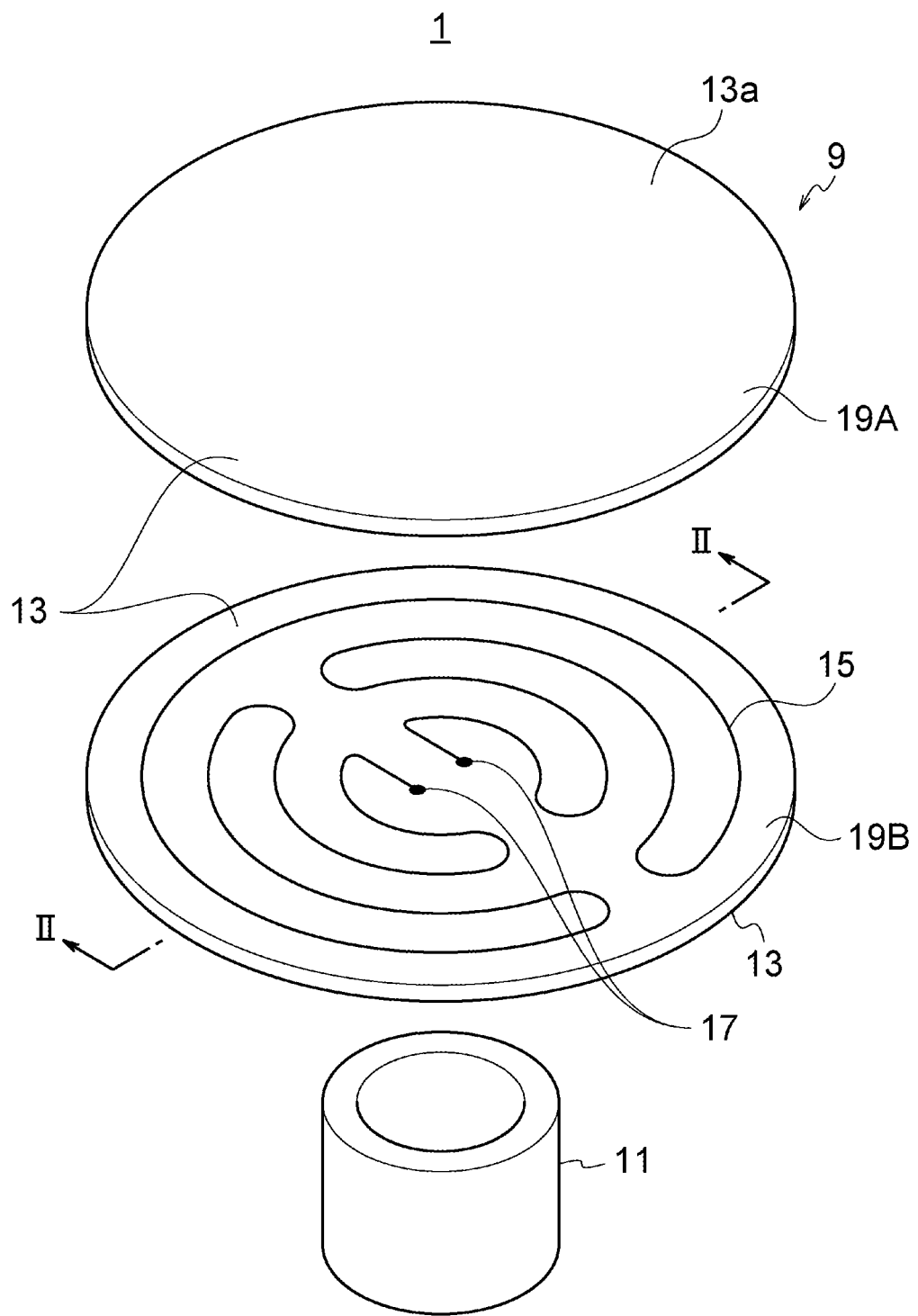
FIG. 1 is a schematic disassembled perspective view showing a configuration of a heater according to an embodiment.

Below, ceramic structures in the present disclosure will be explained by taking ceramic heaters as examples. The drawings which will be referred to below are schematic ones for convenience of explanation. Accordingly, sometimes details will be omitted. Further, Size ratios will not always coincide with the actual ones. Further, the heaters may be further provided with known components which are not shown in the drawings as well.

In the second and following embodiments, basically only differences from those in the previously explained embodiments will be explained. Matters which are not particularly referred to may be considered the same as those in the previously explained embodiments. Further, for convenience of explanation, for the configurations corresponding to each other among the plurality of embodiments, sometimes the same notations will be attached even if there are differences.

For the vertical cross-sectional views (FIG. 3A to FIG. 6B) of the configurations of single terminal parts and their surroundings, unless particularly explained, it may be concluded that the same vertical cross-sectional views are obtained when viewed from any direction around the above single terminal parts (around the center lines vertically extending on the drawing sheets).

First Embodiment (Heater System)

Figure 2:
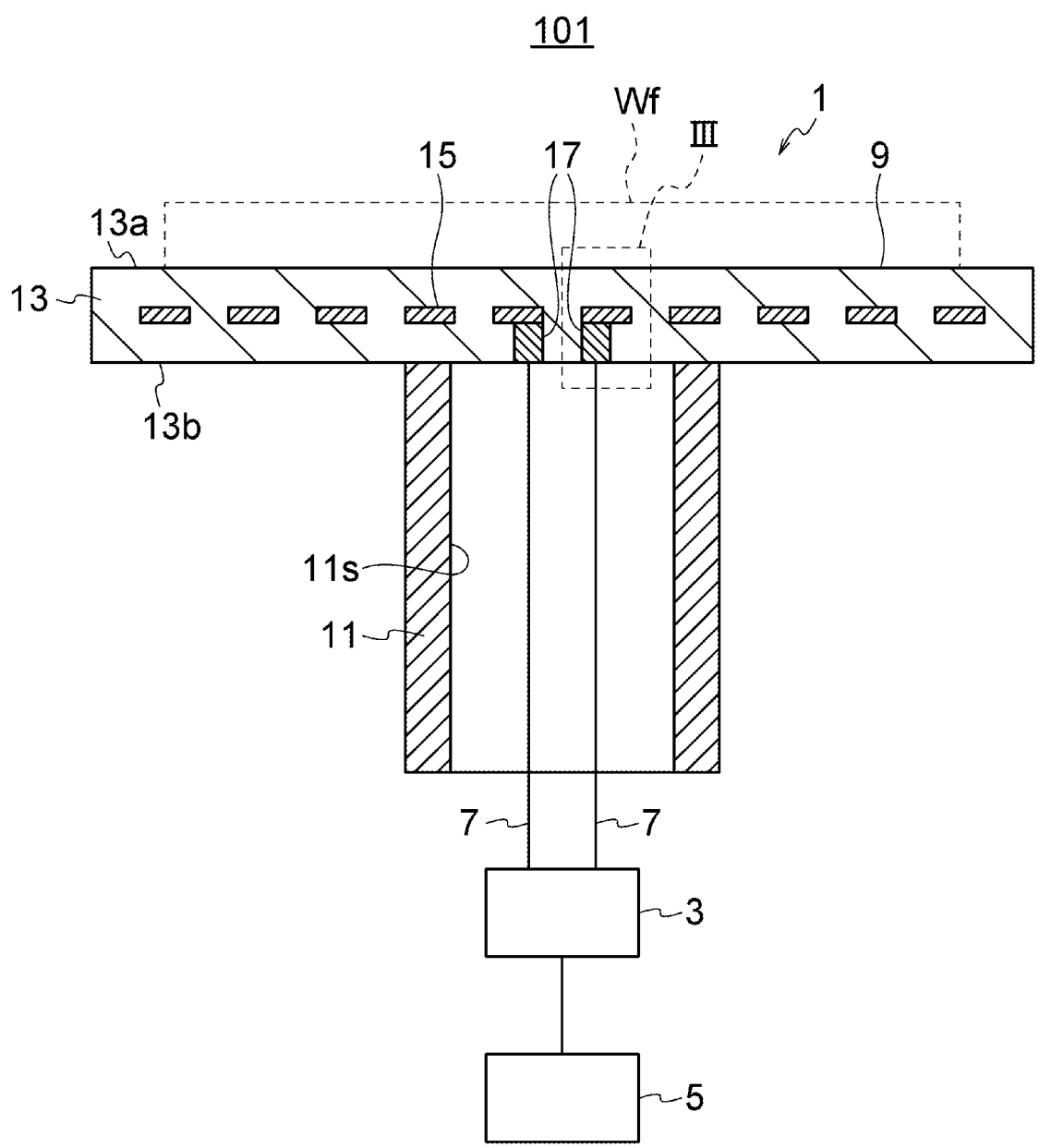
FIG. 2 is a cross-sectional view taken along the II-II line in FIG. 1.

FIG. 1 is a schematic disassembled perspective view showing the configuration of a heater 1 according to an embodiment. FIG. 2 is a schematic view showing the configuration of a heater system 101 including the heater 1 in FIG. 1. In FIG. 2, for the heater 1, a cross-sectional view along the II-II line in FIG. 1 is shown. FIG. 1, for convenience, shows a disassembled heater 1 in order to show the structure of the heater 1. An actual heater 1 after completion need not be able to be disassembled as in the disassembled perspective view in FIG. 1.

Upward in the drawing sheets in FIG. 1 and FIG. 2 is for example vertically upward. However, the heater 1 need not utilize upward in the drawing sheets in FIG. 1 and FIG. 2 as vertically upward. In the following explanation, for convenience, sometimes the "upper surface" and "lower surface" and other terms will be used where the upper directions of the drawing sheets in FIG. 1 and FIG. 2 are upward. When simply referring to "when viewed on a plane", unless particularly explained, it designates viewed from upward in the drawing sheets in FIG. 1 and FIG. 2.

The heater system 101 has a heater 1, a power supply part 3 (FIG. 2) which supplies power to the heater 1, and a control part (FIG. 2) which controls the power supply part 3. The heater 1 and the power supply part 3 are connected by wiring members 7 (FIG. 2). Note that, the wiring members 7 may be grasped as parts of the heater 1 as well. Further, the heater system 101, other than the configurations explained above, may have for example a fluid supply part which supplies gas and/or liquid to the heater 1.

(Heater)

The heater 1 for example has a substantially plate-shaped (disk-shaped in the example shown) heater plate 9 and a pipe 11 which extends from the heater plate 9 downward. The heater plate 9 has a wafer Wf (FIG. 2) placed (superimposed) on an upper surface 13a thereof as one example of a heated object and directly contributes to heating of the wafer. The pipe 11 for example contributes to support of the heater plate 9 and protection of the wiring members 7. Note that, just the heater plate may be grasped as the heater as well.

(Heater Plate)

The upper surface 13a and lower surface 13b of the heater plate 9 are for example substantially planar. The planar shape and various dimensions of the heater plate 9 may be suitably set considering the shape and dimensions etc. of the heated object. For example, the planar shape is circular (example shown) or polygonal (for example rectangular). If showing one example of the dimensions, the diameter is 20 cm to 35 cm and the thickness is 4 mm to 30 mm.

The heater plate 9 is for example provided with an insulating base body 13, a resistance heating element 15 (one example of the internal conductor) buried in the base body 13, and terminal parts 17 for supplying power to the resistance heating element 15. By current running in the resistance heating element 15, heat is generated according to Joule's law. In turn, the wafer placed on the upper surface 13a of the base body 13 is heated.

(Base Body)

The outer shape of the base body 13 configures the outer shape of the heater plate 9. Accordingly, an explanation according to the shape and dimensions of the heater plate 9 explained above may be grasped as an explanation of the outer shape and dimensions of the base body 13 as it is. The material of the base body 13 is for example ceramic. The ceramic is for example a sintered body containing aluminum nitride (AlN), aluminum oxide ($Al_2O_3$, alumina), silicon carbide (SiC), silicon nitride ($Si_3N_4$), or the like as the principal constituent. Note that, the principal constituent is for example a constituent accounting for 50 mass % or more or 80 mass % or more of the material (same is true for the following explanation).

In FIG. 1, the base body 13 is configured by a first insulation layer 19A and second insulation layer 19B. Note that, the base body 13 may be prepared by materials (for example ceramic green sheets) forming the first insulation layer 19A and second insulation layer 19B stacked on each other or may be prepared by a method different from such a method and may be only conceptually grasped as being configured by the first insulation layer 19A and second insulation layer 19B due to presence of the resistance heating element 15 etc. after completion.

The thicknesses of these insulation layers may be suitably set. Also, the ratio occupied of each insulation layer in the thickness of the base body 13 may be suitably set. As will be explained later, the technique according to the present embodiment can be applied to a heater in which the thickness from the lower surface 13b of the base body 13 up to the internal conductor (resistance heating element 15) in the lowermost layer (thickness of the second insulation layer 19B) is relatively thin. When explaining one example of the thickness of the second insulation layer 19B which is relatively thin in this way, it is for example 1 mm to 3 mm. In this case, for example, the thickness of the base body 13 may be made 4 mm to 6 mm.

(Resistance Heating Element)

The resistance heating element 15 extends along (for example parallel to) the upper surface 13a and the lower surface 13b of the base body 13. Further, the resistance heating element 15, when viewed on a plane, for example, extends covering over substantially the entire surface of the base body 13. In FIG. 1, the resistance heating element 15 is positioned between the first insulation layer 19A and the second insulation layer 19B.

The specific pattern (route) of the resistance heating element 15 when viewed on a plane may be made a suitable one. For example, only one resistance heating element 15 is provided in the heater plate 9 and extends from one end to the other end without crossing itself. Further, in the example shown, the resistance heating element 15, in each of the regions obtained by dividing the heater plate 9 into two, extends so as to weave back and forth (meander) in a circumferential direction. Other than this, for example, the resistance heating element 15 may spirally extend or may extend so as to linearly weave back and forth in one radial direction.

The shape when locally viewing the resistance heating element 15 may be made a suitable one. For example, the resistance heating element 15 may be a layered conductor which is parallel to the upper surface 13a and lower surface 13b, may be coil shaped (spring shaped) wound using the above route as the axis, or may be formed in a mesh shape. Also, the dimensions in the various shapes may be suitably set.

The material of the resistance heating element 15 is a conductor (for example metal) which generates heat by flow of current. The conductor may be suitably selected. For example, it is tungsten (W), molybdenum (Mo), platinum (Pt), indium (In), or an alloy containing them as principal constituents. Further, the material of the resistance heating element 15 may be one obtained by firing a conductive paste including the metal as described before as well. That is, the material of the resistance heating element 15 may be one containing glass powder and/or ceramic powder or other additives (from another viewpoint, an inorganic insulation substance).

(Terminal Parts (Outline))

The terminal parts 17, for example, are connected to the two ends of the resistance heating element 15 in the long direction and, at the positions of the two ends, penetrate through parts of the base body 13 on the lower surface 13b side (second insulation layer 19B) to be exposed from the lower surface 13b. Due to this, it becomes possible to supply power from the exterior of the heater plate 9 to the resistance heating element 15. The pair of terminal parts 17 (two ends of the resistance heating element 15) are for example positioned on the center side in the heater plate 9. Note that, three or more terminal parts 17 supplying power to one resistance heating element 15 may be provided or two or more sets of terminal parts 17 supplying power to two or more (for example two or more layers of) resistance heating elements 15 may be provided as well.

(Pipe)

The pipe 11 is hollow shape opened at the top and bottom (two sides in the axial direction). From another viewpoint, the pipe 11 has a space 11s running through it from the top to bottom. The shapes of a transverse cross-section (cross-section perpendicular to the axial direction) and vertical cross-section (cross-section parallel to the axial direction, the cross-section shown in FIG. 2) in the pipe 11 may be suitably set. In the example shown, the pipe 11 is cylinder shaped with a constant diameter relative to the position in the axial direction. Naturally, the pipe 11 may differ in diameter according to the position in the height direction as well. Further, specific values of dimensions of the pipe 11 may be suitably set. Although not particularly shown, in the pipe 11, a flow path in which gas or liquid flows may be formed as well.

The pipe 11 may be configured by ceramic or another insulation material or may be configured by a metal (conductive material). As specific materials of the ceramic, for example, ones (AlN etc.) given in the explanation of the base body 13 may be utilized. Further, the material of the pipe 11 may be the same as the material of the base body 13 or may be different from the latter.

The base body 13 and the pipe 11 may be fixed together out by a suitable method. For example, the two may be fixed together by an adhesive (not shown) interposed between the two, may be fixed together by solid phase bonding without an adhesive interposed between the two, or may be mechanically fixed together by utilizing bolts and nuts (both not shown).

The adhesive may be an organic material, may be an inorganic material, may be a conductive material, or may be an insulation material. Specifically, as the adhesive, for example, use may be made of a glass-based one (glass bonding may be utilized). As the solid phase bonding, for example, diffusion bonding may be utilized. In the diffusion bonding, the base body 13 and the pipe 11 are bonded by hot pressing. The diffusion bonding includes not only one making the base body 13 and the pipe 11 directly abut against each other, but also one arranging a material for promoting bonding between the two. The material may be in a solid phase state or liquid phase state at the time of bonding.

(Wiring Members)

The wiring members 7 are inserted in the space 11s in the pipe 11. In a plane perspective, the plurality of terminal parts 17 are exposed from the base body 13 in a region in the heater plate 9 which is exposed to the space 11s. Further, the wiring members 7 are connected at single ends to the plurality of terminal parts 17.

The plurality of wiring members 7 may be flexible electrical wires, may be rod-shaped conductors without flexibility, or may be a combination of the same. Further, the plurality of flexible electrical wires may be bundled together so as to become like one cable or need not be bundled together. Further, the connections between the wiring members 7 and the terminal parts 17 may be suitable ones. For example, the two may be joined by a conductive bonding material. Further, for example, the two may be screwed together by forming a male screw in one and forming a female screw in the other.

(Details of Terminal Parts)

Figure 3A:
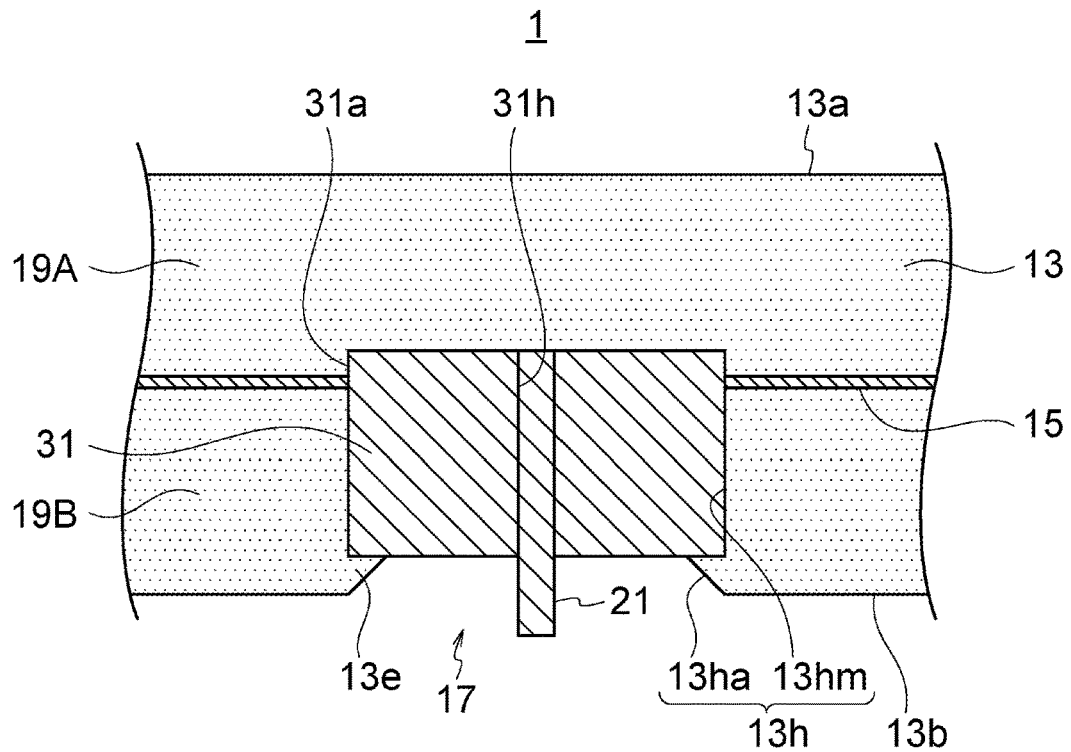
FIG. 3A is a cross-sectional view showing a terminal part and its surroundings in a heater according to a first embodiment.

FIG. 3A is an enlarged view of a region III in FIG. 2.

Each terminal part 17 has a connection conductor 31 which is connected to the internal conductor (resistance heating element 15) and a terminal conductor 21 which extends from the connection conductor 31 to a lower part (side away from the internal conductor). The lower end of the terminal conductor 21 is connected to the wiring member 7. According to such a configuration, it becomes possible to supply power from the wiring member 7 through the terminal part 17 to the resistance heating element 15.

The shape, dimensions, and materials of the connection conductor 31 may be suitably set. For example, the connection conductor 31 may be block shaped as in the example shown or may be plate shaped or rod shaped unlike the example shown. Further, the shape of the connection conductor 31 may be a substantially right angle column shape, may be a conical shape, or may be a frustum shape. Further, for example, the shape when viewed on a plane may be circular, polygonal, or another suitable shape. In the connection conductor 31, any of the size in the vertical direction and the diameter (maximum diameter or minimum diameter) when viewed on a plane may be larger as well.

Further, for example, the length in the vertical direction of the connection conductor 31 may be suitably set so far as the lower surface of the connection conductor 31 is positioned higher than the lower surface 13b of the base body 13. When the connection conductor 31 projects upward from the internal conductor (resistance heating element 15) to which the connection conductor 31 is connected, it is also possible to make the length in the vertical direction of the connection conductor 31 longer than the distance from the resistance heating element 15 connected with the connection conductor 31 up to the lower surface 13b of the base body 13. The length in the vertical direction of the connection conductor 31 may be made for example 1/10 or more, 1/3 or more, 1/2 or more, 2/3 or more, or 4/5 or more relative to the distance from the resistance heating element 15 connected with this connection conductor 31 up to the lower surface 13b. Further, the above length may be 1 time or less, 9/10 or less, 4/5 or less, 2/3 or less, or 1/2 or less relative to the above distance. These lower limits and upper limits may be suitably combined unless they are contradictory. Further, the diameter (for example maximum diameter) of the connection conductor 31 may be made for example 0.1 mm or more, 1 mm or more, 5 mm or more, or 10 mm or more. Further, the diameter may be made 100 mm or less, 50 mm or less, 20 mm or less, 10 mm or less, or 5 mm or less. These lower limits and upper limits may be suitably combined unless they are contradictory.

Further, the material of the connection conductor 31 may be the same as or may be different from the material of the internal conductor (resistance heating element 15) and/or material of the wiring members 7. As the material of the connection conductor 31, for example, there can be mentioned W, Mo, or Pt.

The connection conductor 31, for example, projects upward from the resistance heating element 15 and is connected at its side surface to the resistance heating element 15. However, unlike the example shown, the connection conductor 31 may be connected at its upper surface to the resistance heating element 15 by positioning the upper surface at substantially the same height as the resistance heating element 15. In the connection conductor 31, the portion which is connected with the resistance heating element 15 (upper end and/or a portion at any position in vertical direction in the connection conductor 31) will be called a connection portion 31a.

The connection (for example bonding) between the connection portion 31a and the resistance heating element 15 may be carried out by making the two directly abut against each other or may be carried out by interposing between the two a material different from the two and/or another member. As the latter case, for example, there can be mentioned interposition of a conductive bonding material (not shown) between the connection portion 31a and the resistance heating element 15. The material of the bonding material may be a suitable one. For example, the material may be a composite material including the same constituents as the material of the resistance heating element 15 and the same constituents as the material of the base body 13. As such a composite material, for example, there can be mentioned one containing W and AlN.

The specific shape and various dimensions of the terminal conductor 21 may be suitably set. For example, the terminal conductor 21 is substantially shaft shaped (pin shaped) so as to linearly extend in the vertical direction. The terminal conductor 21 may be solid as illustrated or may be hollow unlike the example shown. The shape of the transverse cross-section may be circular or polygonal or another suitable shape. Further, the shape and size of the transverse cross-section are for example constant in the long direction. However, in the long direction, the shape and size of the transverse cross-section may change as well. The material of the terminal conductor 21 may be for example the same as or different from the material of the internal conductor (resistance heating element 15) and/or the material of the connection conductor 31. As the material of the terminal conductor 21, there can be mentioned W, Mo, or Pt.

The length of the terminal conductor 21 is not particularly limited. For example, the terminal conductor 21 may have an only length long enough to secure the required minimum length for bonding with the wiring member 7 in the portion extending outward from the connection conductor 31 or may extend up to the position close to the lower end of the pipe 11.

The transverse cross-section (diameter) of the terminal conductor 21 is made smaller than the transverse cross-section (diameter) of the connection conductor 31 at least at a position higher than the lower surface 13b of the base body 13. So far as this requirement is satisfied, the diameter of the terminal conductor 21 may be suitably set. For example, the diameter (maximum diameter when not circular) of the terminal conductor 21 may be made 1/100 or more, 1/50 or more, 1/20 or more, 1/10 or more, 1/5 or more, or 1/3 or more relative to the diameter (maximum diameter when not circular) of the connection conductor 31. Further, the diameter (maximum diameter when not circular) of the terminal conductor 21 may be made 4/5 or less, 2/3 or less, 1/3 or less, 1/5 or less, 1/10 or less, 1/20 or less, or 1/50 or less relative to the diameter (maximum diameter when not circular) of the connection conductor 31. These lower limits and upper limits may be suitably combined unless they are contradictory. Further, for example, the diameter (maximum diameter where it is not circular) of the terminal conductor 21 may be made 0.5 mm or more, 1 mm or more, or 3 mm or more. Further, the diameter may be made 1 mm or less, 5 mm or less, or 10 mm or less. These lower limits and upper limits may be suitably combined unless they are contradictory.

The terminal conductor 21 and the connection conductor 31 may be connected by a suitable method. In the example shown, the terminal conductor 21 is inserted in a hole 31h provided in the connection conductor 31. Due to this, the terminal conductor 21 is connected to the connection conductor 31. Note that, unlike the example shown, a hole need not be provided in the connection conductor 31. The lower surface of the connection conductor 31 and the upper part of the terminal conductor 21 may be joined or the connection conductor 31 and the terminal conductor 21 may be formed integrally from the same material.

In the case where the terminal conductor 21 is inserted in the connection conductor 31 as described above, the hole 31h in the connection conductor 31 may be a through hole (example shown) or may be a blind hole (recessed portion) which is opened downward. Further, the upper surface of the terminal conductor 21 may be flush with the upper surface of the connection conductor 31 (example shown), may be positioned higher than the upper surface of the connection conductor 31, or may be positioned lower than the upper surface of the connection conductor 31 (in this case, the hole in the connection conductor 31 may be a through hole or may blind).

Figure 3B:
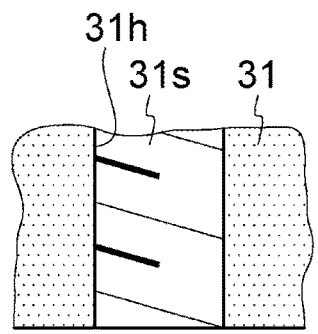
FIG. 3B is a disassembled perspective view of a portion of the terminal part in FIG. 3A.
Figure 3B:
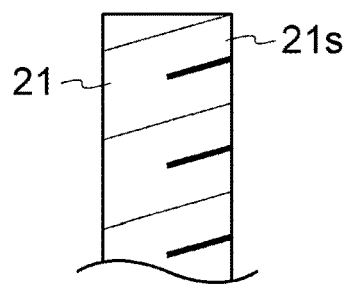

Further, the outer surface of the terminal conductor 21 and the inner surface of the hole in the connection conductor 31 may be suitably connected. For example, as illustrated in FIG. 3B, a male screw 21s may be formed in the terminal conductor 21, a female screw 31s may be formed in the connection conductor 31, and the two may be screwed together. Further, for example, the terminal conductor 21 and the connection conductor 31 may simply abut against each other. In this case, crimping may be carried out. Further, for example, the terminal conductor 21 and the connection conductor 31 may be joined by a conductive bonding material interposed between the two as well.

The terminal conductor 21 and the wiring member 7 may be connected by a suitable method as given in the explanation of the wiring members 7. For example, they may be screwed together by formation of a male screw in one of the two and formation of a female screw in the other, may be fixed by crimping, or may be joined by a conductive bonding material. Further, in the explanations of the embodiments, the terminal conductor 21 and the wiring members 7 will be explained as different members. However, it is also possible to form the two integrally by the same material.

(Details of Surroundings of Terminal Parts)

The base body 13 has holes 13h in which the connection conductors 31 are inserted. Each hole 13h has a hole body 13hm which contacts the upper surface and side surface of a connection conductor 31 at the inner surface. Further, the hole 13h has a reduced-diameter portion 13ha which is smaller in diameter than the diameter of the connection conductor 31 (hole body 13hm) lower than the lower surface of the connection conductor 31. From another viewpoint, the base body 13 has a projecting portion 13e which projects from the inner surface of the hole 13h toward the center side of the hole 13h and configures the reduced-diameter portion 13ha. By provision of the reduced-diameter portion 13ha, the connection conductor 31 becomes harder to detach from the hole 13h.

The shape and dimensions of the reduced-diameter portion 13ha (projecting portion 13e) may be suitably set. In the example shown, the reduced-diameter portion 13ha has the minimum diameter at the same height (position in the vertical direction) as the lower surface of the connection conductor 31. That is, the projecting portion 13e contacts the lower surface of the connection conductor 31. Further, the reduced-diameter portion 13ha is formed so as to increase in diameter the further from the lower surface of the connection conductor 31 to the lower surface 13b of the base body 13. The reduced-diameter portion 13ha has the maximum diameter at the lower surface 13*b* of the base body 13. In the vertical cross-section as shown in FIG. 3A, the inner surface of the reduced-diameter portion 13*ha* may be linear, may be curved so as to be recessed on the side of interior of the hole 13*h*, may be curved so as to project on the side of the interior of the hole 13*h*, or may be a combination of the same.

The shape of the reduced-diameter portion 13*ha* when viewed on a plane may be for example similar or may not be similar to the shape of the connection conductor 31 when viewed on a plane, and may be made circular, polygonal, or another suitable shape. Further, the shape of the reduced-diameter portion 13*ha* when viewed on a plane may be a shape distorted so that a part in the inner surface projects closer to the center side of the hole 13*h* than other parts in the inner surface. Further, when viewed on a plane, the inner surface of the reduced-diameter portion 13*ha* need not be positioned on an inner side from the outer edge of the lower surface of the connection conductor 31 over its whole circumference, and may be positioned on the inner side from the outer edge of the lower surface of the connection conductor 31 in only a part as well.

The minimum diameter (diameter in the uppermost portion in the present embodiment) of the reduced-diameter portion 13*ha*, the maximum diameter (diameter in the lowermost portion in the present embodiment), and the size in the vertical direction may be suitably set. For example, the minimum diameter of the reduced-diameter portion 13*ha* may be made the diameter of the terminal conductor 21 or more and less than the diameter of the connection conductor 31 (in a case where it is not circular when viewed on a plane, diameters in the same direction may be compared with each other, same is true for the following explanation). For example, a half of the difference between the minimum diameter of the reduced-diameter portion 13*ha* and the diameter of the lower surface of the connection conductor 31 (maximum projection amount of the projecting portion 13*e* from the outer edge of the lower surface of the connection conductor 31) may be made $1/100$ or more, $1/50$ or more, $1/10$ or more, $1/5$ or more, $1/3$ or more, or $1/2$ or more relative to a half of the diameter of the lower surface of the connection conductor 31. Further, the half of the above difference may be made $4/5$ or less, $1/2$ or less, $1/3$ or less, $1/5$ or less, $1/10$ or less, or $1/20$ or less relative to the half of the diameter of the lower surface of the connection conductor 31. These lower limits and upper limits may be suitably combined unless they are contradictory. Further, for example, the half of the difference between the minimum diameter of the reduced-diameter portion 13*ha* and the diameter of the lower surface of the connection conductor 31 may be made 0.01 mm or more, 0.05 mm or more, 0.1 mm or more, 0.2 mm or more, or 1 mm or more. Further, the half of the difference may be made 5 mm or less, 1 mm or less, 0.5 mm or less, or 0.1 mm or less. These lower limits and upper limits may be suitably combined unless they are contradictory. Further, the maximum diameter of the reduced-diameter portion 13*ha* may be made for example not more than the diameter of the hole body 13 *hm*. Further, it is also possible to make the maximum diameter of the reduced-diameter portion 13*ha* larger than the diameter of the hole body 13*hm*. The size in the vertical direction of the reduced-diameter portion 13*ha* may be made for example $1/50$ or more, $1/20$ or more, $1/10$ or more, $1/5$ or more, $1/3$ or more, or $1/2$ or more relative to the distance from the resistance heating element 15 in the lowermost layer up to the lower surface 13*b*. Further, the above size may be made $2/3$ or less, $1/2$ or less, $1/5$ or less, $1/10$ or less, or $1/20$ or less relative to the above distance. These lower limits and upper limits may be suitably combined unless they are contradictory.

(Method for Manufacturing Heater)

In a method for manufacturing the heater 1, for example, the heater plate 9, pipe 11, wiring members 7, and the like are separately prepared from each other. After that, these members are fixed to each other. However, part or all of the heater plate 9 and the pipe 11 may be prepared together as well. The methods for manufacturing the pipe 11 and the wiring members 7 may be made for example the same as known various methods.

The method for manufacturing the heater plate 9 may be made for example the same as various known methods excluding the method of preparation of the terminal parts 17 and reduced-diameter portions 13*ha* (projecting portions 13*e*). For example, the heater plate 9 may be prepared by firing a laminate of ceramic green sheets for forming the first insulation layer 19A and second insulation layer 19B in which a conductive paste forming the resistance heating element 15 is arranged. Further, the heater plate 9 may be prepared by arranging a coil forming the resistance heating element 15 and raw material powder of ceramic forming the base body 13 in a die and hot pressing it (that is, using a hot press method).

The method of providing the terminal parts 17 in the heater plate 9 is for example as follows.

In a case where ceramic green sheets are fired to prepare the heater plate 9, for example, holes 13*h* are formed in the ceramic green sheets configuring parts in the base body 13 into which the terminal parts 17 are inserted. The connection conductors 31 are inserted into these holes 13*h*. Note that, on at least part of the inner surfaces of the holes 13*h* and the outer surfaces of the upper end side portions of the terminal parts 17, conductive pastes which become the bonding materials may be coated. After that, the ceramic green sheets are fired.

In the case where the terminal parts 17 are provided in this way, the base body 13 may fasten the connection conductors 31 by contraction of the ceramic at the time of firing as well. For example, the holes 13*h* before firing may be made sizes which are equal to or larger than the diameters of the connection conductors 31 and which become smaller than the diameters of the connection conductors 31 due to contraction by firing (assuming no connection conductors 31 are provided). The difference between the diameters of the connection conductors 31 and the diameters of the holes 13*h* after contraction when assuming no connection conductors 31 may be made for example 0.2 mm to 0.4 mm.

Further, in a case where the heater plate 9 is prepared according to the hot pressing method, for example, the connection conductors 31 may be placed in a die for hot pressing the raw material powder of the ceramic forming the base body 13, and cores forming portions (reduced-diameter portions 13*ha* or the like) on the side lower than the connection conductors 31 in the holes 13*h* may be placed inside the die.

Note that, it is also possible to insert the connection conductors 31 into the holes 13*h* in the base body 13 after firing and bonding the two by the bonding materials. Further, the terminal conductors 21, while depending on its method of preparation and/or method of fixation with the connection conductors 31, may be fixed to the connection conductors 31 before firing or may be fixed to the connection conductors 31 after firing.

The reduced-diameter portions 13*ha* may be formed by a suitable method. For example, the connection conductors 31 may be inserted into the holes 13h in the ceramic green sheets forming the base body 13, then raw ceramic materials before firing for forming the projecting portions 13e may be arranged on the inner surfaces of the holes 13h and the ceramic green sheets may be fired. It is also possible to arrange the raw ceramic materials forming the projecting portions 13e on the inner surfaces of the holes 13h in the base body 13 after firing and to fire the result again. Further, for example, due to the action of the holes 13h in the ceramic green sheets becoming reduced in diameters from the connection conductors 31 by firing, the inner surfaces of the holes 13h may project toward the center side at a lower position than the connection conductors 31 to thereby form the reduced-diameter portions 13ha. Further, for example, the arrangement of the raw materials described above and projections due to contraction may be combined as well. In the hot press method, for example, the reduced-diameter portions 13ha may be formed by making the diameters of the already explained cores smaller than the diameters of the connection conductors 31.

As explained above, in the present embodiment, the ceramic structure constituted as the heater 1 has the base body 13, internal conductor (resistance heating element 15), and terminal parts 17. The base body 13 is made of ceramic and is a plate shape having an upper surface 13a on which the wafer Wf is superimposed and a lower surface 13b on the opposite side to the upper surface 13a. The resistance heating element 15 is positioned inside the base body 13. The terminal parts 17 are electrically connected to the resistance heating element 15, have at least parts positioned inside the base body 13, and are exposed from the lower surface 13b of the base body 13 to the exterior of the base body 13. The base body 13 has the holes 13h formed in the lower surface 13b. The terminal parts 17 have the connection conductors 31. The connection conductors 31 are inserted in the holes 13h and are connected to the resistance heating element 15. The lower surfaces of the connection conductors 31 are positioned on the side closer to the upper surface 13a of the base body 13 than the lower surface 13b of the base body 13. The holes 13h have the reduced-diameter portions 13ha having smaller diameters than the diameters of the connection conductors 31 (the diameters in the same direction may be compared where not circular when viewed on a plane) between the lower surfaces of the connection conductors 31 and the lower surface 13b of the base body 13.

Accordingly, for example, the probability of connection conductors 31 dropping out from the hole 13h can be lowered. As a result, for example, bonding areas of the connection conductors 31 and the base body 13 (from another viewpoint, contact lengths in the vertical direction) can be reduced. In turn, in the base body 13, the thickness from the resistance heating element 15 up to the lower surface 13b can be made thin and/or the vertical length of the connection conductors 31 can be made shorter. By making the thickness on the lower surface 13b side in the base body 13 thin, for example, the heat of the resistance heating element 15 can be transferred to the upper surface 13a of the base body 13. Further, by making the lengths of the connection conductors 31 in the vertical direction short, for example, the heat which is transferred from the resistance heating element 15 through the connection conductors 31 to the lower part of the base body 13 is reduced, therefore the upper surface 13a of the base body 13 can be efficiently heated.

Further, in the present embodiment, the reduced-diameter portions 13ha increase in diameters the more from the lower surfaces of the connection conductors 31 to the lower surface 13b of the base body 13. In this case, for example, compared with an aspect in which the diameters are reduced the closer to the lower surface 13b (FIG. 4B which will be explained later), the connection conductors 31 and the projecting portions 13e easily engage even with very small downward deviations of the connection conductors 31. As a result, a probability of poor conduction between the resistance heating element 15 and the connection conductors 31 due to deviation of the connection conductors 31 is lowered, therefore the reliability of the electrical connection can be improved. Further, for example, compared with an aspect in which the diameters of the reduced-diameter portions 13ha are constant in the vertical direction (FIG. 4A which will be explained later), a heat capacity of the base body 13 just under the connection conductors 31 can be made smaller. As a result, for example, it becomes easier to transfer upward the heat which was transferred from the resistance heating element 15 through the connection conductors 31 to the projecting portions 13e.

Further, in the present embodiment, the terminal parts 17 have the terminal conductors 21 with parts which are positioned lower than the connection conductors 31. The connection conductors 31 have female screws 31s formed in the lower surfaces of the connection conductors 31. The terminal conductors 21 have male screws 21s screwed with the female screws 31s. In this case, for example, the reliability of fixation of the two can be improved. Further, for example, the terminal conductors 21 can be attached to the connection conductors 31 after firing the base body 13, therefore the conditions of firing are eased. From another viewpoint, the degree of freedom of design of the terminal conductors 21 is improved. For example, as already explained, the terminal conductors 21 may be made parts of the wiring members 7 as well.

Second Embodiment

Figure 4A:
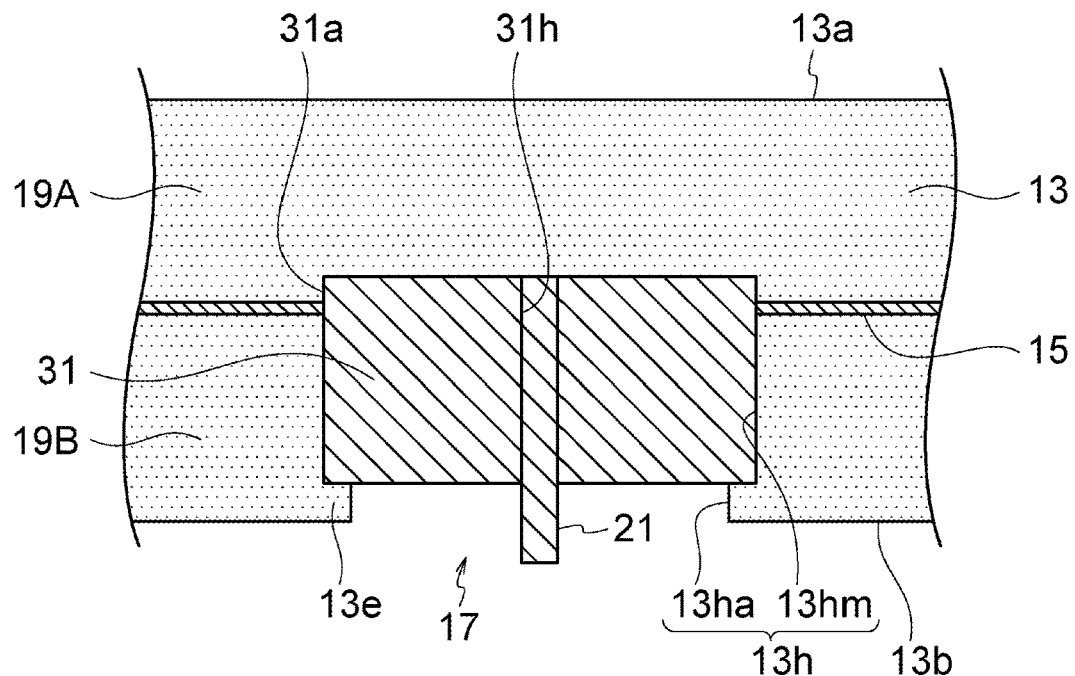
FIG. 4A and FIG. 4B are cross-sectional views showing terminal parts and their surroundings in heaters according to second and third embodiments.

FIG. 4A is a view showing the configuration of a principal part in a heater 201 according to a second embodiment and corresponds to FIG. 3A for the first embodiment.

The heater 201 differs in the shape of the reduced-diameter portions 13ha (projecting portions 13e) from the heater 1 in the first embodiment. Specifically, the reduced-diameter portions 13ha are constant in shapes and sizes (diameters) of the transverse cross-sections (cross-sections parallel to the lower surface 13b) from the lower surfaces of the connection conductors 31 to the lower surface 13b of the base body 13. The term "constant" referred to here, for example, may be considered the case where, in each of the two projecting portions 13e appearing at the vertical cross-sections as shown in FIG. 4A, a difference between the minimum value and the maximum value of the amounts of projection of the projecting portions 13e from the outer edges of the lower surfaces of the connection conductors 31 is 20% or less or 10% or less of the maximum value. For a specific example of the sizes of the diameters of the reduced-diameter portions 13ha in the present embodiment, for example, the explanation of the specific example of the sizes of the minimum diameters (diameters at the positions on the lower surfaces of the connection conductors 31) of the reduced-diameter portions 13ha in the first embodiment may be employed.

In the present embodiment as well, the same effects as those by the first embodiment are exerted by the holes 13h having the reduced-diameter portions 13ha. For example, the probability of connection conductors 31 dropping out from the base body 13 is lowered. Further, in the present embodiment, the reduced-diameter portions 13ha have constant diameters from the lower surfaces of the connection conductors 31 up to the lower surface 13b of the base body 13. In this case, for example, in the same way as the first embodiment, compared with an aspect in which the diameters of the reduced-diameter portions 13ha are reduced more toward the lower part (FIG. 4B), very small downward deviations of the connection conductors are easily restricted. Further, for example, compared with the first embodiment, it is easy to raise the strengths of the projecting portions 13e.

Third Embodiment

Figure 4B:
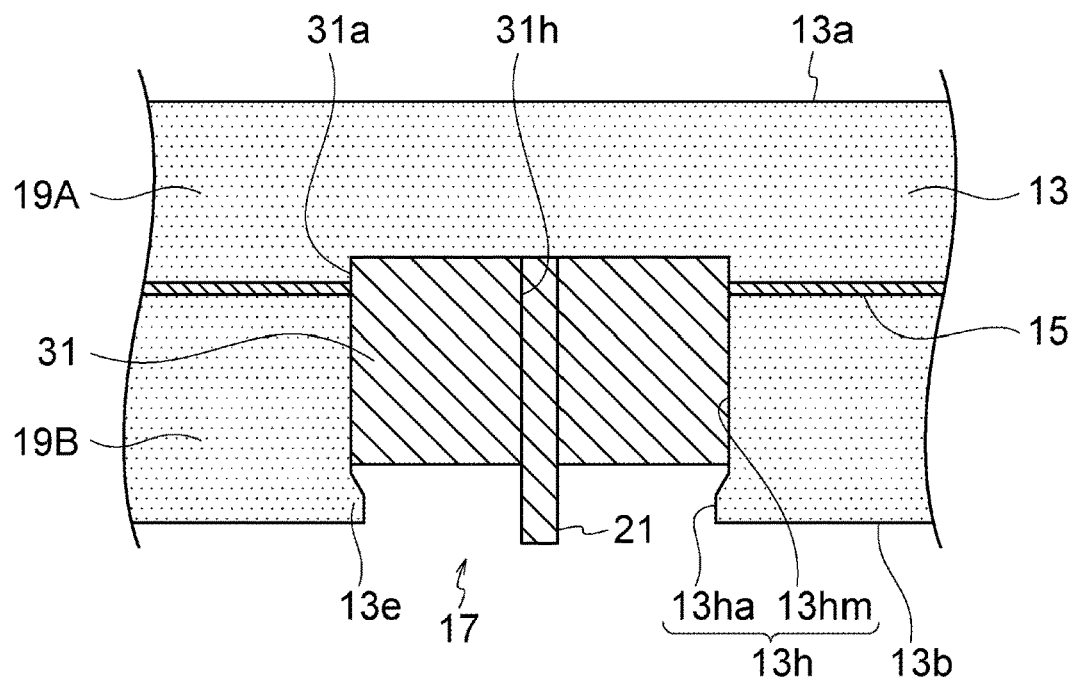

FIG. 4B is a view showing the configuration of a principal part in a heater 301 according to a third embodiment and corresponds to FIG. 3A for the first embodiment.

The heater 301 differs in the shapes of the reduced-diameter portions 13ha (projecting portions 13e) from the heater 1 in the first embodiment. Specifically, the reduced-diameter portions 13ha are reduced in diameters more the closer to the lower surface 13b of the base body 13 from the lower surfaces of the connection conductors 31. Note that, between the reduced-diameter portions 13ha in the present embodiment and the reduced-diameter portions 13ha in the first embodiment, the relationships in the vertical direction between the portions having the minimum diameters and the portions having the maximum diameters are reverse. However, so far as they are replaced with each other concerning this point, the explanation for the reduced-diameter portions 13ha in the first embodiment (for example the explanation for the shapes of the inner surfaces, the sizes of the minimum diameters and the sizes of the maximum diameters, and the like) may be employed for the explanation of the reduced-diameter portions 13ha according to the present embodiment.

In the present embodiment as well, the same effects as those by the first embodiment are exerted by the holes 13h having the reduced-diameter portions 13ha. For example, the probability of connection conductors 31 dropping out from the base body 13 is lowered. Further, in the present embodiment, the reduced-diameter portions 13ha are reduced in diameters more the closer to the lower surface 13b of the base body 13 from the lower surfaces of the connection conductors 31. In this case, for example, compared with the first embodiment (FIG. 3A), concentration of stress generated in the upper side portion of the roots of the projecting portions 13e when the connection conductors 31 vertically thermally expand can be reduced. Further, for example, compared with the second embodiment (FIG. 4A), in the same way as the first embodiment, the heat capacity of the base body 13 just under the connection conductors 31 can be made small.

Fourth Embodiment

Figure 5:
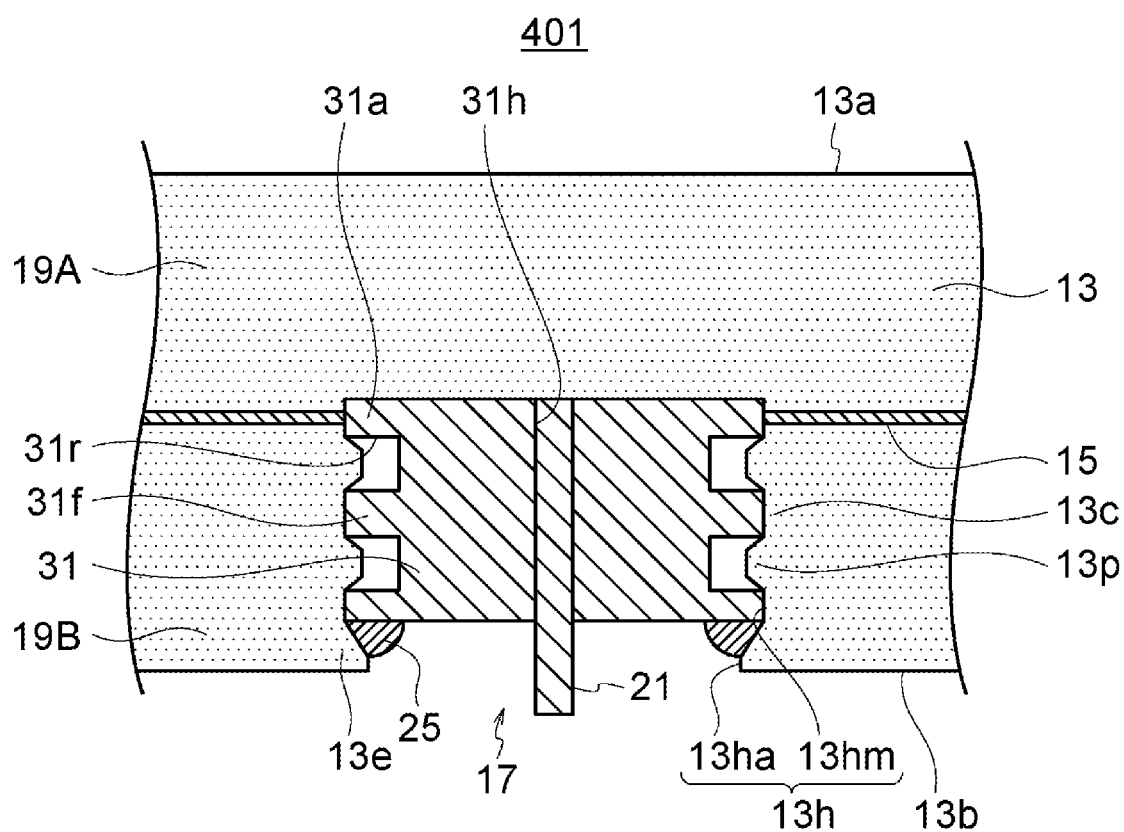
FIG. 5 is a cross-sectional view showing a terminal part and its surroundings in a heater according to a fourth embodiment.

FIG. 5 is a view showing the configuration of a principal part in a heater 401 according to a fourth embodiment and corresponds to FIG. 3A for the first embodiment.

The heater 401 differs in the shapes of the connection conductors 31 from the heaters in the other embodiments. Note that, in the example shown, as the configuration of the reduced-diameter portions 13ha in the base body 13, the one in the third embodiment (FIG. 4B) is illustrated. However, the connection conductors 31 in the present embodiment may be combined with the reduced-diameter portions 13ha in the first or second embodiment (FIG. 3 or FIG. 4A) as well.

In the present embodiment, in the connection conductors 31, recessed retracted portions 31r are formed in the side surfaces (outer circumferential surfaces). From another viewpoint, if based on the bottom surfaces of the retracted portions 31r, the connection conductors 31 have projecting portions 31f which project sideward around the retracted portions 31r (for example upper parts or lower parts of the retracted portions 31r). Note that, in the example shown, the retracted portions 31r are formed in the side surfaces of a right angle column. However, it is also possible to provide the retracted portions 31r in the side surfaces of a block shape other than a right angle column. Note that, for the shapes and sizes of the connection conductors 31 when viewed on a plane in the portions (for example connection portions 31a) other than at the retracted portions 31r, the explanation for the shapes and sizes of the connection conductors 31 when viewed on a plane in the first embodiment may be employed.

The number, shapes, and dimensions of the retracted portions 31r (projecting portions 31f) may be suitably set. For example, only one retracted portion 31r may be provided or two or more of them may be provided. Further, in a case where two or more retracted portions 31r are provided, they may have mutually the same shapes or may have mutually different shapes. The plurality of retracted portions 31r may be arranged or distributed in the vertical direction and/or horizontal direction or another suitable direction. The pitch of arrangement or density of distribution may be equal or uniform or may be biased in any direction.

Further, for example, when viewing the outer circumferential surfaces of the connection conductors 31 in their normal direction (when viewing the outer circumferential surfaces laid out in a plane shape), the retracted portions 31r may have shapes extending in groove shapes or may have shapes where the lengths in the directions perpendicular to each other are not extremely different (for example circular or polygonal shapes which are generally assumed). The groove-shaped retracted portions 31r for example may extend in the horizontal direction or may spirally extend like thread grooves. Further, in the retracted portions 31r, the shapes of the transverse cross-sections perpendicular to the normal direction may be constant relative to the position in the depth direction of the retracted portions 31r or may change according to the position in the depth direction.

Further, for example, the lengths of the retracted portions 31r in the vertical direction (thickness direction of the base body 13) in the case where retracted portions 31r are provided at only one position in the vertical direction, or the totals of the lengths in the vertical direction of the plurality of retracted portions 31r in the case where retracted portions 31r are provided at a plurality of positions, may be made for example 1/50 or more, 1/10 or more, 1/5 or more, 1/3 or more, or 1/2 or more relative to the lengths of the connection conductors 31 in the vertical direction. Further, the above lengths or the above totals of lengths of the retracted portions 31r may be made 9/10 or less, 2/3 or less, 1/2 or less, or 1/5 or less relative to the lengths of the connection conductors 31. The lower limits and the upper limits described above may be suitably combined unless they are contradictory. Further, the lengths of the retracted portions 31r in the vertical direction may be made for example 0.1 mm or more.

In the example shown, retracted portions 31r are provided at two positions in the vertical direction. At each position, the retracted portion 31r for example extends so as to surround the connection conductor 31 when viewed on a plane. That is, the retracted portions 31r are configured by recessed grooves which surround the connection conductors 31, while the projecting portions 31f are configured by ridges or flanges. Otherwise, at each position, when viewed on a plane, a plurality of retracted portions 31r are arranged so as to surround the connection conductors 31. In this case, at one position in the vertical direction, the number of the plurality of retracted portions 31r and intervals of the same may be suitably set. For example, at one position in the vertical direction, the number of the plurality of retracted portions 31r is three or more, and the plurality of retracted portions 31r may be arranged so that the angular interval among the retracted portions 31r becomes 120° or less on the plan view. The retracted portions 31r formed by surrounding recessed grooves or plurality of retracted portions 31r which are arranged so as to surround the connection conductors may be provided at a suitable number of positions in the vertical direction. For example, these may be provided at one to three positions.

On the inner surfaces of the holes 13h, regions facing the retracted portions 31r project into the retracted portions 31r and configure penetrating portions 13p. The shapes and sizes of the penetrating portions 13p may be made suitable ones. In the example shown, the penetrating portions 13p are formed in tapered shapes. Further, there are spaces between the penetrating portions 13p and the inner surfaces of the retracted portions 31r. The spaces may be sealed with a suitable gas or may be evacuated (state reduced in pressure more than the atmospheric air). Further, unlike the example shown, the penetrating portions 13p may substantially fill the retracted portions 31r as well.

The heater 401, for example, in the same way as the first embodiment, may be prepared by insertion of the connection conductors 31 into the holes 13h of the base body 13 before firing or after firing. In a case where the connection conductors 31 are inserted into the holes 13h in the ceramic green sheets forming the base body 13 and the result is fired, the connection conductors 31 may be fastened by the base body 13 by contraction of the base body 13 by firing. At this contraction, regions which face the retracted portions 31r at the inner surfaces of the holes 13h are pushed into the retracted portions 31r. Due to this, the penetrating portions 13p are formed. Further, the heater 401 may be prepared by the hot pressing method as well. In this case, the raw material powder of ceramic forming the base body 13 is filled in the retracted portions 31r, and the penetrating portions 13p having shapes filled in the retracted portions 31r are formed.

In the present embodiment as well, by provision of the reduced-diameter portions 13ha, the same effects as those by the other embodiments are exerted. Further, in the present embodiment, the connection conductors 31 have recessed retracted portions 31r in the outer circumferential surfaces which are surrounded by the inner surfaces of the holes 13h. In this case, for example, the penetrating portions 13p entering into the retracted portions 31r are engaged with the connection conductors 31 (projecting portions 31f), therefore the probability of connection conductors 31 dropping out from the base body 13 can be lowered. From another viewpoint, the loads applied to the projecting portions 13e can be reduced. Further, for example, in a case where spaces are formed in the retracted portions 31r, the contact areas of the portions in the base body 13 which are at the side lower than the resistance heating element 15 and the connection conductors 31 are reduced and the heat which is transferred from the resistance heating element 15 through the connection conductors 31 to the lower part of the base body 13 is reduced, thus the upper surface 13a of the base body 13 can be efficiently heated. These effects by the retracted portions 31r are improved by the retracted portions 31r extending so as to surround the connection conductors 31 when viewing the base body 13 on a plane or the plurality of retracted portions 31r being arranged so as to surround the connection conductors 31 when viewing the base body 13 on a plane.

In the example shown in FIG. 5, sealing materials 25 which are adhered to the lower surfaces of the connection conductors 31 and the inner surfaces of the reduced-diameter portions 13ha and seal the outer circumferential surfaces of the connection conductors 31 and the inner surfaces of the hole bodies 13hm are shown. Such sealing materials 25 may be provided not only in the present embodiment, but also in the other embodiments. The material of the sealing materials 25 may be suitable one. For example, it may be a general glass seal or use may be made of a CaO—Al$_2$O$_3$—Y$_2$O$_3$ adhesive.

Fifth Embodiment

Figure 6A:
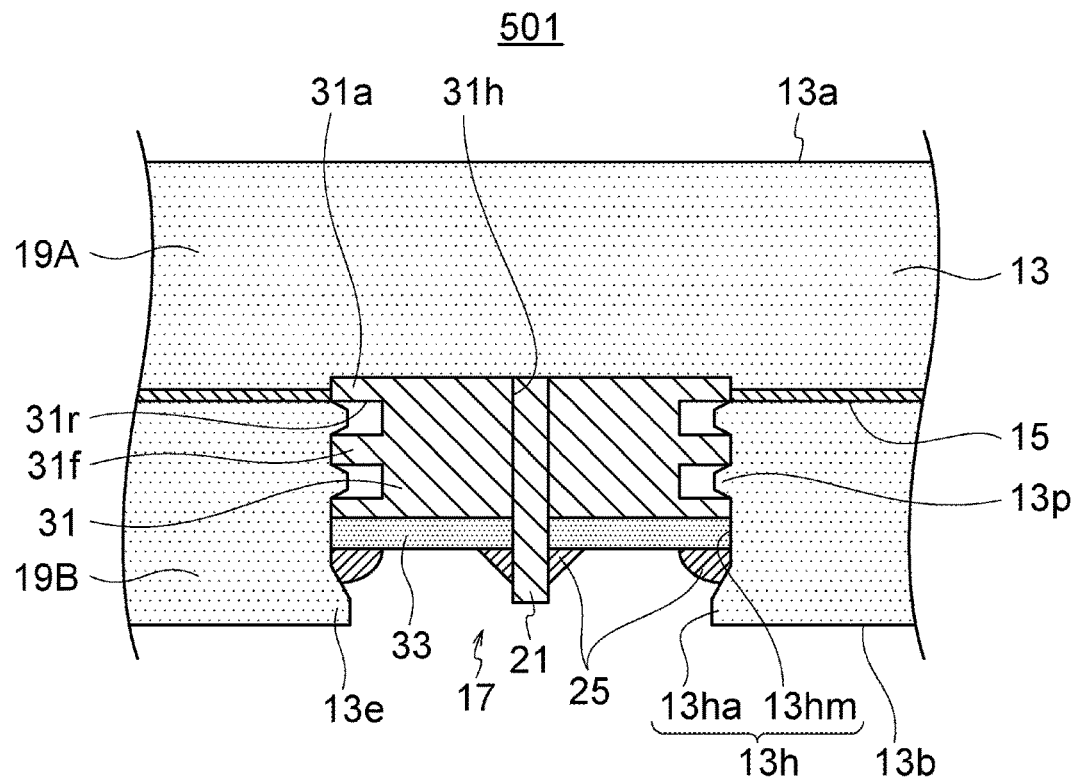
FIG. 6A and FIG. 6B are cross-sectional views showing terminal parts and their surroundings in heaters according to fifth and sixth embodiments.

FIG. 6A is a view showing the configuration of a principal part in a heater 501 according to a fifth embodiment and corresponds to FIG. 3A for the first embodiment.

The heater 501 differs from the other embodiments in the point that sealing members 33 are provided below the connection conductors 31. Note that, in the example shown, as the configuration of the reduced-diameter portions 13ha in the base body 13, the one in the third embodiment (FIG. 4B) is illustrated. However, the connection conductors 31 in the present embodiment may be combined with the reduced-diameter portions 13ha in the first or second embodiment (FIG. 3 or FIG. 4A) as well.

The material of the sealing members 33 may be any of a conductor or insulator. For example, it is a ceramic. The ceramic configuring the sealing members 33 may be the same as or different from the ceramic configuring the base body 13. Further, in the latter case, the principal constituents of the two may be the same or may be different. Specific examples of the ceramic are for example as given in the explanation of the base body 13.

The shapes and sizes of the sealing members 33 when viewed on a plane are for example substantially set so that the members fit in the lower ends of the hole bodies 13hm of the holes 13h. From another viewpoint, the shapes and sizes of the sealing members 33 when viewed on a plane are made equal to the shapes and sizes of the lower surfaces of the connection conductors 31. Further, the outer circumferential surfaces of the sealing members 33 and the inner surfaces of the holes 13h are joined. The two are for example bonded by adhesion of ceramic particles in the two. However, an adhesive may be interposed between the two as well. Note that, when the ceramic particles are adhered at the boundary between the sealing members 33 and the base body 13 as described above, depending on the constituents of the materials of the two or the like, from the viewpoint of the materials, the boundary of the two members is vague or nonexistent. However, it is possible to identify the boundary of the two members from the positions of the outer edges of the lower surfaces of the connection conductors 31.

The sealing members 33 are for example substantially plate shaped. That is, the lengths in the vertical direction (thickness of the plate) are shorter compared with the lengths in various directions when viewed on a plane. For example, the thicknesses of the sealing members 33 are 1/5 or less or 1/10 or less of the diameters (for example minimum diameters) of the sealing members 33. However, the sealing members 33 may be block shaped as well.

The lower surfaces of the connection conductors 31 and the upper surfaces of the sealing members 33 for example abut against each other. However, there may be gaps or a bonding material may be interposed between the two. Further, the terminal conductors 21 pass through the through holes (notation is omitted) in the sealing members 33 and extend outward lower than the sealing members 33 (sides away from the internal conductor). The reduced-diameter portions 13$ha$ are positioned lower than the sealing members 33. Accordingly, the projecting portions 13$e$, unlike the first to fourth embodiments, are engaged with the lower surfaces of the sealing members 33.

In the example shown, provision is made of sealing materials 25 which are adhered to the lower surfaces of the sealing members 33 and the inner surfaces of the reduced-diameter portions 13$ha$ and seal the outer circumferential surfaces of the sealing members 33 and the inner circumferential surfaces of the hole bodies 13$hm$. Further, provision is made of sealing members 25 which are adhered to the lower surfaces of the sealing members 33 and the outer circumferential surfaces of the terminal conductors 21 and seal the inner circumferential surfaces of the through holes in the sealing members 33 and the outer circumferential surfaces of the terminal conductors 21. However, these sealing members 25 need not be provided either.

The method for manufacturing the heater 501 may be basically the same as the methods for manufacturing the heaters in the other embodiments. The sealing members 33 in for example a state before firing or after firing are arranged together with the connection conductors 31 inside the holes 13$h$ in the base body 13 before firing and are fired together with the base body 13. Due to this, the sealing members 33 and the inner surfaces of the holes 13$h$ are joined by adhesion of the ceramic particles. Note that, it is also possible to make the ceramic particles adhere to each other by arranging the sealing members 33 before firing or after firing in the base body 13 after firing and firing the base body 13 again, or joining the sealing members 33 after firing and the base body 13 after firing by solid phase bonding. The solid phase bonding is as explained in the explanation of the pipe 11.

In the present embodiment as well, by provision of the reduced-diameter portions 13$ha$, the same effects as those by the other embodiments are exerted.

Further, in the present embodiment, the heater 501 has the sealing members 33 made of ceramic. The terminal parts 17 have terminal conductors 21 which are connected to the connection conductors 31 and at least partially are positioned lower than the connection conductors 31. The sealing members 33 close the holes 13$h$ below the connection conductors 31 in a state where the terminal conductors 21 are made to pass through them.

The connection conductors 31 are larger in diameter compared with the terminal conductors 21. Therefore, compared with a case where the connection conductors 31 are not provided and only the terminal conductors 21 are buried in the base body 13, the areas of the terminal parts 17 exposed below the holes 13$h$ are large. In turn, there is a possibility of deterioration of characteristics due to oxidation or the like. However, by providing the sealing members 33 as in the present embodiment, for example, an oxidation resistance of the terminal parts 17 is improved. Further, for example, by the sealing members 33 being made of ceramic, the joints with the base body 13 are made stronger and the probability of connection conductors 31 dropping off from the base body 13 can be lowered. From another viewpoint, the loads applied from the connection conductors to the projecting portions 13$e$ can be dispersed to the joints between the sealing members 33 and the base body 13. Further, for example, by thermal insulation of the lower surfaces of the connection conductors 31 by the sealing members 33, the heat which escapes from the resistance heating element 15 through the connection conductors 31 to the exterior of the base body 13 can be reduced.

Sixth Embodiment

Figure 6B:
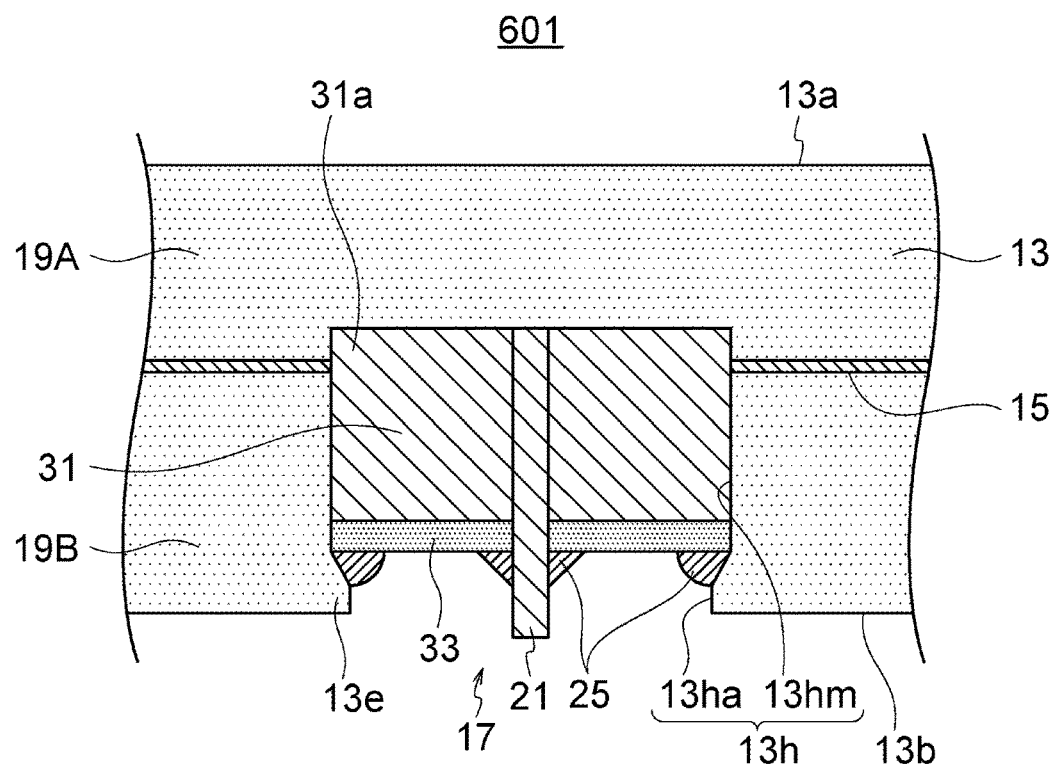

FIG. 6B is a view showing the configuration of a principal part of a heater 601 according to a sixth embodiment and corresponds to FIG. 3A for the first embodiment.

In the fifth embodiment, the sealing members 33 were applied to the connection conductors 31 having the retracted portions 31$r$. However, as in the present embodiment, the sealing members 33 may also be applied to connection conductors 31 having no retracted portions 31$r$. The configuration of the reduced-diameter portions 13$ha$ may be any of the first to third embodiments (FIG. 3 to FIG. 4B) in the same way as the fifth embodiment.

[One Example of Material of Heater]

As already explained, the base body 13 is configured by ceramic. Here, the crystal grain sizes of the ceramic may be substantially uniform over the entirety of the base body 13 or may be different from each other among portions in the base body 13. Below, one example in the latter case will be explained by taking as an example the fourth and fifth embodiments (FIG. 5 and FIG. 6).

In the fourth and fifth embodiments, the connection conductors 31 have the recessed retracted portions 31$r$ in the outer circumferential surfaces. Accordingly, the base bodies 13 have portions (below, referred to as the "abutting portions 13$c$") which contact the outer circumferential surfaces of the connection conductors 31 at the surroundings of the retracted portions 31$r$ (contact the outer circumferential surfaces of the projecting portions 31$f$) and portions (penetrating portions 13$p$) which face the retracted portions 31$r$.

Figure 7A:
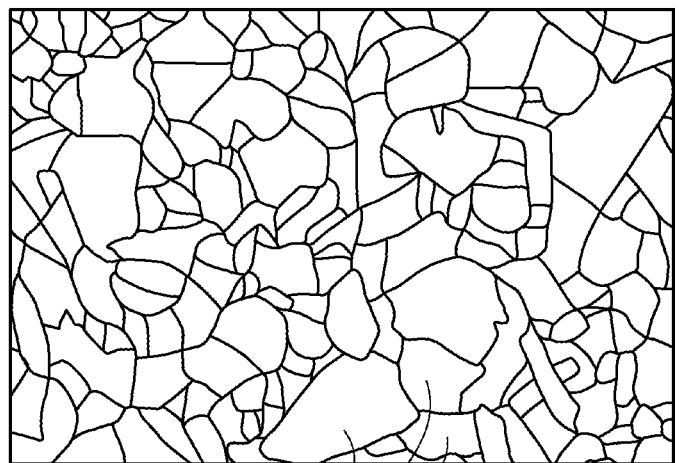
FIG. 7A and FIG. 7B are cross-sectional views showing examples of materials of the heaters.
Figure 7B:
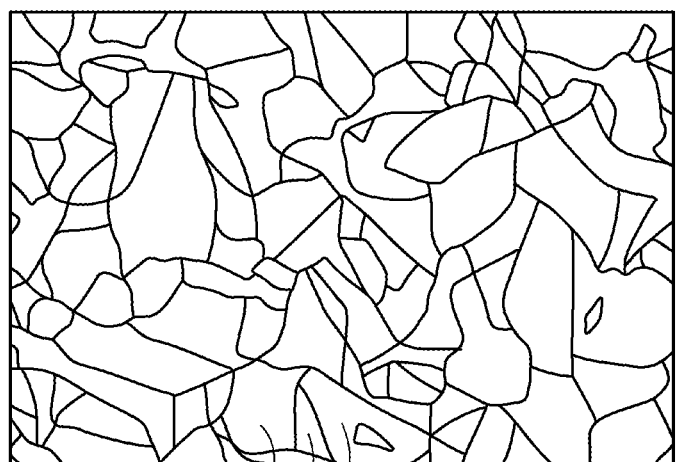

FIG. 7A and FIG. 7B are cross-sectional views of parts of the base body 13. FIG. 7A is a view of the penetrating portions 13$p$, and FIG. 7B is a view of the abutting portions 13$c$. These cross-sectional views show ranges where one side becomes 50 μm to 200 μm. A plurality of grains Gr (single crystal grains, ceramic particles) are shown. From another viewpoint, grain boundaries are shown. As shown in these views, the mean value of the crystal grain sizes (mean grain size) in the abutting portions 13$c$ may be made larger than the mean value of the crystal grain sizes in the penetrating portions 13$p$.

In this case, for example, the larger the crystal grain size in the ceramic, the larger the Young's modulus. Therefore, the strength of the abutting portions 13$c$ can be made relatively high. Here, when considering the stress in the diameter direction that the base body 13 receives from the connection conductors 31 when the connection conductors 31 expand due to heat, the stress in the abutting portions 13$c$ is larger than the stress in the penetrating portions 13$p$. The reason for this for example may be that the penetrating portions 13$p$ do not abut against the connection conductors 31 in the diameter direction and/or the amount of expansion of the connection conductors 31 in the diameter direction is relatively large at the positions where the diameters are large (positions of the projecting portions 31$f$). Accordingly, for example, due to the strength of the abutting portions 13$c$ becoming relatively high, probability of occurrence of cracks in the entirety of the base body 13 can be reduced.

Further, for example, the smaller the crystal grain size, the lower the heat conductivity. Therefore, the heat conductivity in the penetrating portions 13$p$ can be made relatively low. Accordingly, for example, the heat which is transferred from the resistance heating element 15 through the connection conductors 31 to the lower part of the base body 13 is reduced and thus the upper surface 13$a$ of the base body 13 can be efficiently heated. As already explained, in the case where spaces are formed in the retracted portions 31$r$, the contact areas between the base body 13 and the connection conductors 31 are reduced, whereby the heat transferred from the resistance heating element 15 through the connection conductors 31 to the lower part of the base body 13 can be reduced. Accordingly, for example, as the retracted portions 31$r$ are made larger, the heating efficiency is improved more also from the viewpoint of the crystal grain size and the viewpoint of space, therefore design is easy.

The constituents and mean grain size of the ceramic in an aspect where the mean grain size in the penetrating portions 13$p$ is smaller than the mean grain size in the abutting portions 13$c$ in this way may be suitably set. For example, the principal constituent of the ceramic may be made aluminum nitride (AlN). The mean grain size in the penetrating portions 13$p$ may be made for example 3 μm to 8 μm. The mean grain size in the abutting portions 13$c$ may be made for example 5 μm to 12 μm (however, larger than the mean grain size in the penetrating portions 13$p$). The abutting portions 13$c$ and penetrating portions 13$p$ may include sintering aids which are the same or have the same principal constituents. The element configuring the sintering aid may be made for example yttrium (Y).

Note that, the mean grain size may be measured by a suitable method. One example will be shown below. The mean of the circle equivalent diameter of the crystals in the principal constituents (for example AlN) of the abutting portions 13$c$ and penetrating portions 13$p$ will be regarded as the mean grain size. The circle equivalent diameter is measured as follows. First, a cross-section of each of the abutting portions 13$c$ and penetrating portions 13$p$ is machined to a mirror surface. The machined cross-sections are photographed by a SEM (scanning electron microscope). The magnification at this time is made substantially 1000 times to 3000 times. Further, the projection area is made 1000 μm$^2$ to 20000 μm$^2$. Next, in the photographed images, profiles of the crystals of the principal constituents are traced by black lines. At this time, where sintering aids are contained, the crystals containing the sintering aids are colored black. The traced images are analyzed by using a procedure such as particle analysis of the image analyzing software "Azokun" (trademark, made by Asahi Kasei Engineering Corporation). By this analysis, the mean of the circle equivalent diameter of the particles is obtained.

The method of making the mean grain size in the abutting portions 13$c$ larger than the mean grain size in the penetrating portions 13$p$ may be made a suitable one. For example, in the manufacturing method explained in the explanation of the fourth embodiment, a method of inserting the connection conductors 31 into the holes 13$h$ of a shaped article (ceramic green sheets) forming the base body 13 and firing the result is employed. In this case, the inner surfaces of the holes 13$h$ for example abut against the projecting portions 31$f$ and face the retracted portions 31$r$ through spaces. Accordingly, the abutting portions 13$c$ more easily receive pressure from the connection conductors 31 compared with the penetrating portions 13$p$, therefore firing is carried out in a state where a relatively high pressure is given. As a result, the grain sizes in the abutting portions 13$c$ become larger than the grain sizes in the penetrating portions 13$p$.

In the above embodiments, each of the heaters 1, 201, 301, 401, 501, and 601 is one example of the ceramic structure. The heater system 101 is one example of the wafer system. The resistance heating element 15 is one example of the internal conductor.

The heater according to the present disclosure is not limited to the above embodiments and may be worked in various ways.

In the embodiments, as the ceramic structure, ceramic heaters having heating functions were taken as examples. However, the ceramic structure may be one having another function as well. For example, the ceramic structure may be an electrostatic chuck or plasma generation-use structure, or may be one functioning as a combination of two or more of the electrostatic chuck, plasma generation-use structure and heater as well.

In other words, the internal conductor was a heating-use resistance heating element in the embodiments. However, the internal conductor may be a conductor for another purpose. For example, the internal conductor may be an electrostatic chuck-use electrode or plasma generation-use electrode. The ceramic structure may have one of these electrodes and a resistance heating element or a combination of two or more selected from among them. The internal conductor is for example a conductor which may have, in its entirety, a shape that extends along the upper surface of the base body (13) (faces the upper part). Further, for example, when assuming the minimum convex curve surrounding the entirety of the internal conductor when viewed on a plane, the region surrounded by the convex curve accounts for 60% or more or 80% or more of the upper surface of the base body.

REFERENCE SIGNS LIST

1 . . . heater (ceramic structure), 13 . . . base body, 13$a$ . . . upper surface, 13$b$ . . . lower surface, 13$h$ . . . hole, 13$ha$ . . . reduced-diameter portion, 15 . . . resistance heating element (internal conductor), 17 . . . terminal part, and 31 . . . connection conductor.

The invention claimed is:

1. A ceramic structure comprising:
a plate-shaped base body made of ceramic and comprising an upper surface on which a wafer is superimposed and a lower surface on an opposite side to the upper surface;
an internal conductor inside the base body; and
a terminal part which is electrically connected to the internal conductor, is located inside the base body in at least a part, and is exposed from the lower surface of the base body to an exterior of the base body, wherein
the base body comprises a hole opened at the lower surface of the base body,
the terminal part comprises a connection conductor which is inserted in the hole and is connected to the internal conductor, wherein the connection conductor comprises a recessed retracted portion in an outer circumferential surface surrounded by an inner surface of the hole, and the base body comprises a penetrating portion which projects to the inside of the retracted portion,
a lower surface of the connection conductor is, with respect to the lower surface of the base body, located on a side where the upper surface of the base body is located, and the hole comprises a reduced-diameter portion between the lower surface of the connection conductor and the lower surface of the base body, the reduced-diameter portion having a diameter smaller than a diameter of the connection conductor.

2. The ceramic structure according to claim 1, wherein the reduced-diameter portion increases in diameter the closer to the lower surface of the base body from the lower surface of the connection conductor.

3. The ceramic structure according to claim 1, wherein the reduced-diameter portion has a constant diameter from the lower surface of the connection conductor to the lower surface of the base body.

4. The ceramic structure according to claim 1, wherein the reduced-diameter portion is reduced in diameter more the closer to the lower surface of the base body from the lower surface of the connection conductor.

5. The ceramic structure according to claim 1, wherein the retracted portion extends so as to surround the connection conductor in a plan view of the lower surface of the base body, or a plurality of the retracted portions are arranged so as to surround the connection conductor in the plan view of the lower surface of the base body.

6. The ceramic structure according to claim 1, wherein a space is formed between the retracted portion and the inner surface of the hole.

7. The ceramic structure according to claim 1, wherein a mean crystal grain size in a portion in the base body which contacts the outer circumferential surface of the connection conductor at a surrounding of the retracted portion is larger than a mean crystal grain size in a portion in the base body which faces the retracted portion.

8. The ceramic structure according to claim 1, further comprising a sealing member made of ceramic, wherein
the terminal part comprises a terminal conductor, the terminal conductor being connected to the connection conductor and comprising at least a portion which is located lower than the connection conductor, and
the sealing member below the connector conductor closes the hole in a state where the terminal conductor is passed through the sealing member.

9. The ceramic structure according to claim 1, wherein
the terminal part comprises a terminal conductor which is partially located lower than the connection conductor,
the connection conductor comprises a female screw which is opened at the lower surface of the connection conductor, and
the terminal conductor comprises a male screw which is screwed into the female screw.

10. A wafer system comprising:
a ceramic structure according to claim 1;
a power supply part which supplies power to the terminal part; and
a control part which controls the power supply part.

11. A ceramic structure comprising:
a plate-shaped base body made of ceramic and comprising an upper surface on which a wafer is superimposed and a lower surface on an opposite side to the upper surface;
an internal conductor inside the base body; and
a terminal part which is electrically connected to the internal conductor, is located inside the base body in at least a part, and is exposed from the lower surface of the base body to an exterior of the base body, wherein
the base body comprises a hole opened at the lower surface of the base body,
the terminal part comprises a connection conductor which is inserted in the hole and is connected to the internal conductor, wherein the connection conductor comprises a recessed retracted portion in an outer circumferential surface surrounded by an inner surface of the hole and a mean crystal grain size in a portion in the base body which contacts the outer circumferential surface of the connection conductor at a surrounding of the retracted portion is larger than a mean crystal grain size in a portion in the base body which faces the retracted portion,
a lower surface of the connection conductor is, with respect to the lower surface of the base body, located on a side where the upper surface of the base body is located, and
the hole comprises a reduced-diameter portion between the lower surface of the connection conductor and the lower surface of the base body, the reduced-diameter portion having a diameter smaller than a diameter of the connection conductor.

12. The ceramic structure according to claim 11, wherein the retracted portion extends so as to surround the connection conductor in a plan view of the lower surface of the base body, or a plurality of the retracted portions are arranged so as to surround the connection conductor in the plan view of the lower surface of the base body.

13. The ceramic structure according to claim 11, wherein a space is formed between the retracted portion and the inner surface of the hole.

14. The ceramic structure according to claim 11, further comprising a sealing member made of ceramic, wherein
the terminal part comprises a terminal conductor, the terminal conductor being connected to the connection conductor and comprising at least a portion which is located lower than the connection conductor, and
the sealing member below the connector conductor closes the hole in a state where the terminal conductor is passed through the sealing member.

15. A wafer system comprising:
a ceramic structure according to claim 11;
a power supply part which supplies power to the terminal part; and
a control part which controls the power supply part.

16. A ceramic structure comprising:
a plate-shaped base body made of ceramic and comprising an upper surface on which a wafer is superimposed and a lower surface on an opposite side to the upper surface;
an internal conductor inside the base body;
a sealing member made of ceramic; and
a terminal part which is electrically connected to the internal conductor, is located inside the base body in at least a part, and is exposed from the lower surface of the base body to an exterior of the base body, wherein
the base body comprises a hole opened at the lower surface of the base body,
the terminal part comprises a connection conductor which is inserted in the hole and is connected to the internal conductor,
a lower surface of the connection conductor is, with respect to the lower surface of the base body, located on a side where the upper surface of the base body is located,
the hole comprises a reduced-diameter portion between the lower surface of the connection conductor and the lower surface of the base body, the reduced-diameter portion having a diameter smaller than a diameter of the connection conductor,
the terminal part comprises a terminal conductor, the terminal conductor being connected to the connection conductor and comprising at least a portion which is located lower than the connection conductor, and the sealing member below the connector conductor closes the hole in a state where the terminal conductor is passed through the sealing member.

17. The ceramic structure according to claim 16, wherein the reduced-diameter portion increases in diameter the closer to the lower surface of the base body from the lower surface of the connection conductor.

18. The ceramic structure according to claim 16, wherein the reduced-diameter portion has a constant diameter from the lower surface of the connection conductor to the lower surface of the base body.

19. The ceramic structure according to claim 16, wherein the reduced-diameter portion is reduced in diameter more the closer to the lower surface of the base body from the lower surface of the connection conductor.

20. A wafer system comprising:
a ceramic structure according to claim 16;
a power supply part which supplies power to the terminal part; and
a control part which controls the power supply part.

* * * * *